US007234951B2

(12) United States Patent
Wang

(10) Patent No.: US 7,234,951 B2
(45) Date of Patent: Jun. 26, 2007

(54) ELECTRICAL CONNECTOR WITH PROTECTIVE COVER FOR POST HEADER

(75) Inventor: Shi-Yong Wang, Shenzhen (CN)

(73) Assignee: Hon Hai Prescision Ind. Co., Ltd., Taipei Hsien (TW)

(*) Notice: Subject to any disclaimer, the term of this patent is extended or adjusted under 35 U.S.C. 154(b) by 0 days.

(21) Appl. No.: 11/313,132

(22) Filed: Dec. 20, 2005

(65) Prior Publication Data

US 2006/0134949 A1 Jun. 22, 2006

(30) Foreign Application Priority Data

Dec. 20, 2004 (CN) .................... 2004 2 055026 U

(51) Int. Cl.
*H01R 12/00* (2006.01)
*H05K 1/00* (2006.01)

(52) U.S. Cl. ........................................ 439/79

(58) Field of Classification Search .................. 439/79, 439/78, 695, 80
See application file for complete search history.

(56) References Cited

U.S. PATENT DOCUMENTS

| | | | | |
|---|---|---|---|---|
| 4,550,962 | A * | 11/1985 | Czeschka | 439/78 |
| 4,857,017 | A * | 8/1989 | Erk | 439/695 |
| 5,688,129 | A * | 11/1997 | Flaherty | 439/79 |
| 6,093,033 | A * | 7/2000 | Kuki et al. | 439/79 |
| 6,561,829 | B2 * | 5/2003 | Maeda et al. | 439/247 |
| 6,821,161 | B1 * | 11/2004 | Cao | 439/701 |
| 2001/0023142 | A1 * | 9/2001 | Miwa et al. | 439/79 |
| 2002/0192988 | A1 * | 12/2002 | Droesbeke et al. | 439/79 |
| 2003/0166348 | A1 * | 9/2003 | Martin et al. | 439/79 |

* cited by examiner

*Primary Examiner*—Tulsidas C. Patel
*Assistant Examiner*—Vladimir Imas
(74) *Attorney, Agent, or Firm*—Wei Te Chung

(57) ABSTRACT

A header connector assembly is provided in which a protective cover (50) is engageably attached to an end portion of the header connector housing (30) such that when the protective cover and the connector housing engage, the cover and the connector housing combine to form a complete planar mating surface (53), for engaging with a printed circuit board, wherein the complete planar mating surface is larger in size than a mating face (301) of the connector housing.

8 Claims, 7 Drawing Sheets

ELECTRICAL CONNECTOR WITH PROTECTIVE COVER FOR POST HEADER

BACKGROUND OF THE INVENTION

1. Field of the Invention

The present invention relates to electrical connectors, and more particularly to header connectors that have protective cover for post headers.

2. Discussion of the Related Art

Header connectors are known in which an array of posts are held in an insulative housing in a manner that allows first ends of the posts to extend from the housing for insertion into corresponding through-holes of a circuit board, and second ends of the posts to extend from the housing for establishing electrical connection with complementary contacts of a mating connector. One such header shown in FIG. 7 is an unshrouded header in which an array of four contact posts has elongated portions thereof extend in a row through an insulative body portion 20 molded therearound, with post end portions 102, 104 extending beyond mating faces 201, 203 of the body portion 20 for mating with contacts of the complementary connector (not shown) and the substrate 3. A friction lock wall 22 is disposed proximate to the second end portions 104 for allowing the mating connector to be secured thereto. Since the insulative body portion 20 is typically molded around the row of contact posts to form a continuous strip, so a limited contact mating surface 201 is formed adjacent the first end portions 102 for engagement with the circuit board 3. Thus a problem arises when the header is subjected to improper external forces that it tends to cause the first end portions 102 to be disengaged from the circuit board 3, thereby resulting in electrical connection failure between the posts and the circuit board 3.

In addition, there is possibility that the insulative body portion 20 might be open at one side thereof, in a direction that is normal to the second mating face 203 of the header, and thus the exposed contact post portions may be subjected to contamination by the outside dust.

Therefore, it is desired to provide a new header connector assembly which overcomes the above-mentioned disadvantages.

DETAILED DESCRIPTION

Figure 1:
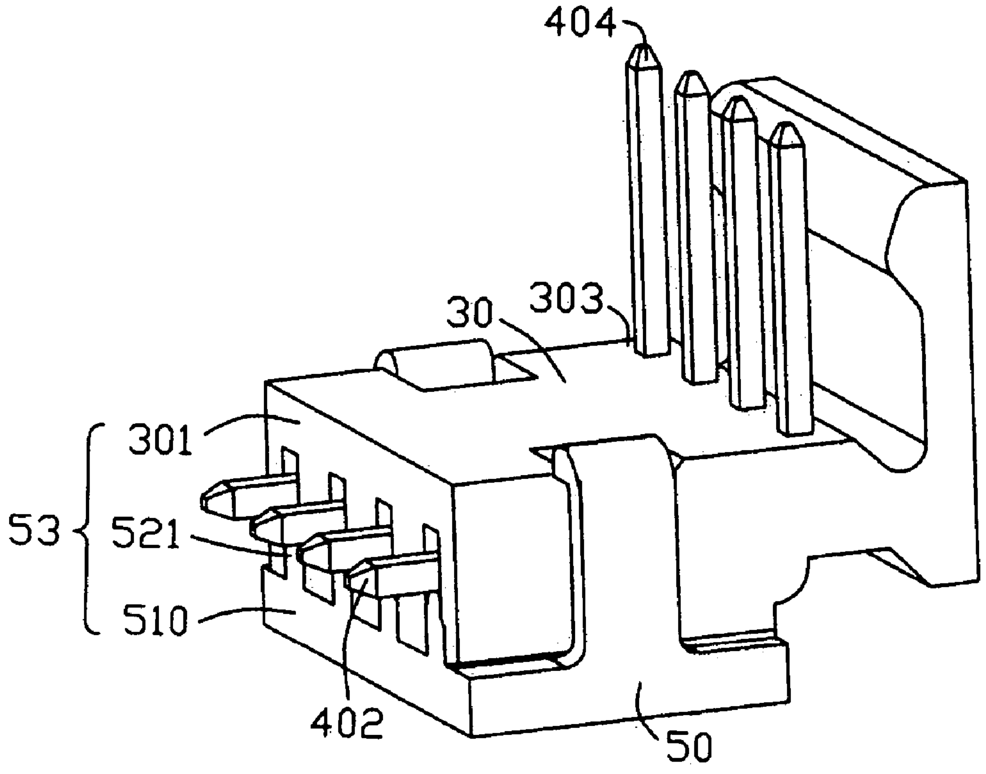
FIG. 1 is an assembled, isometric view of a header connector assembly according to a first embodiment of the present invention.
Figure 2:
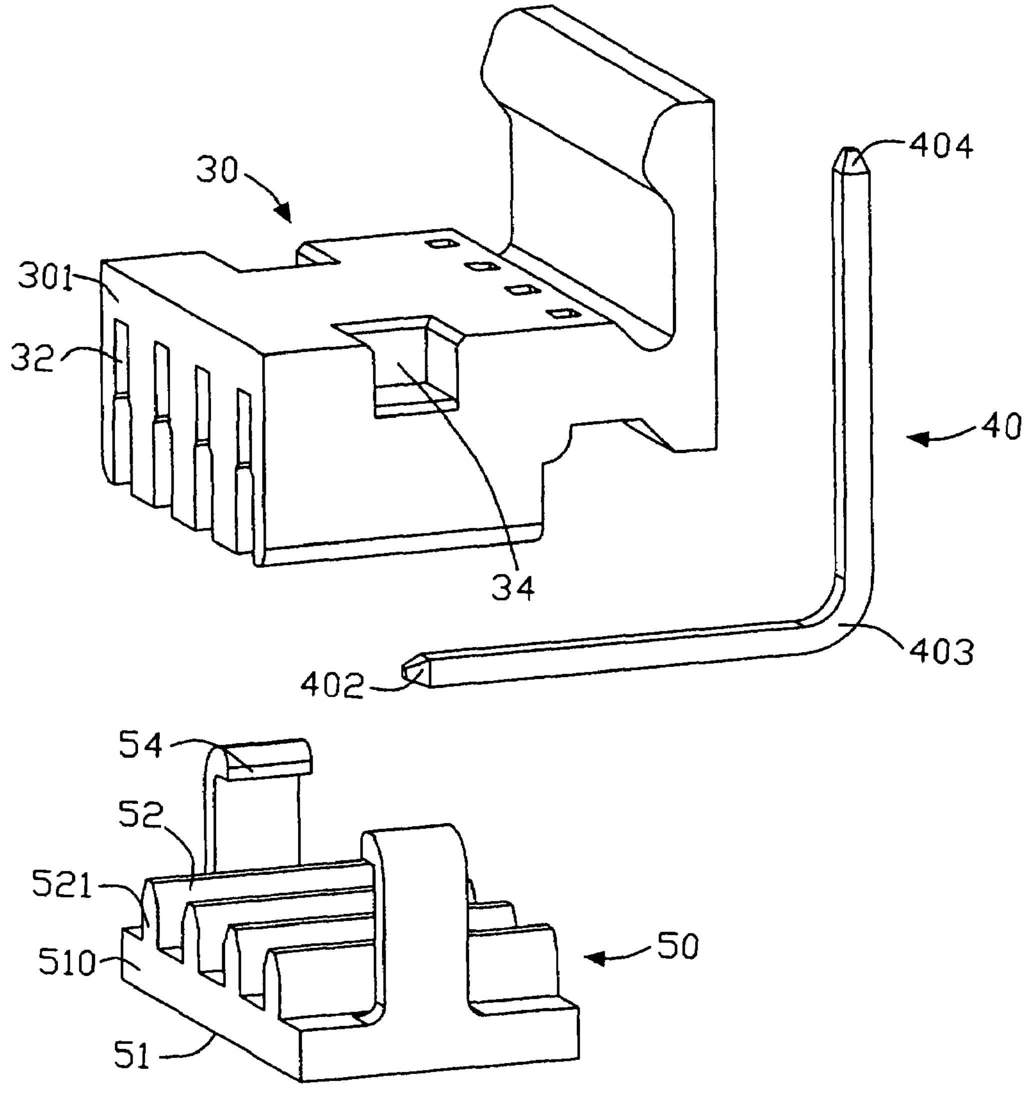
FIG. 2 is an exploded, isometric view of the header connector assembly of FIG. 1.
Figure 3:
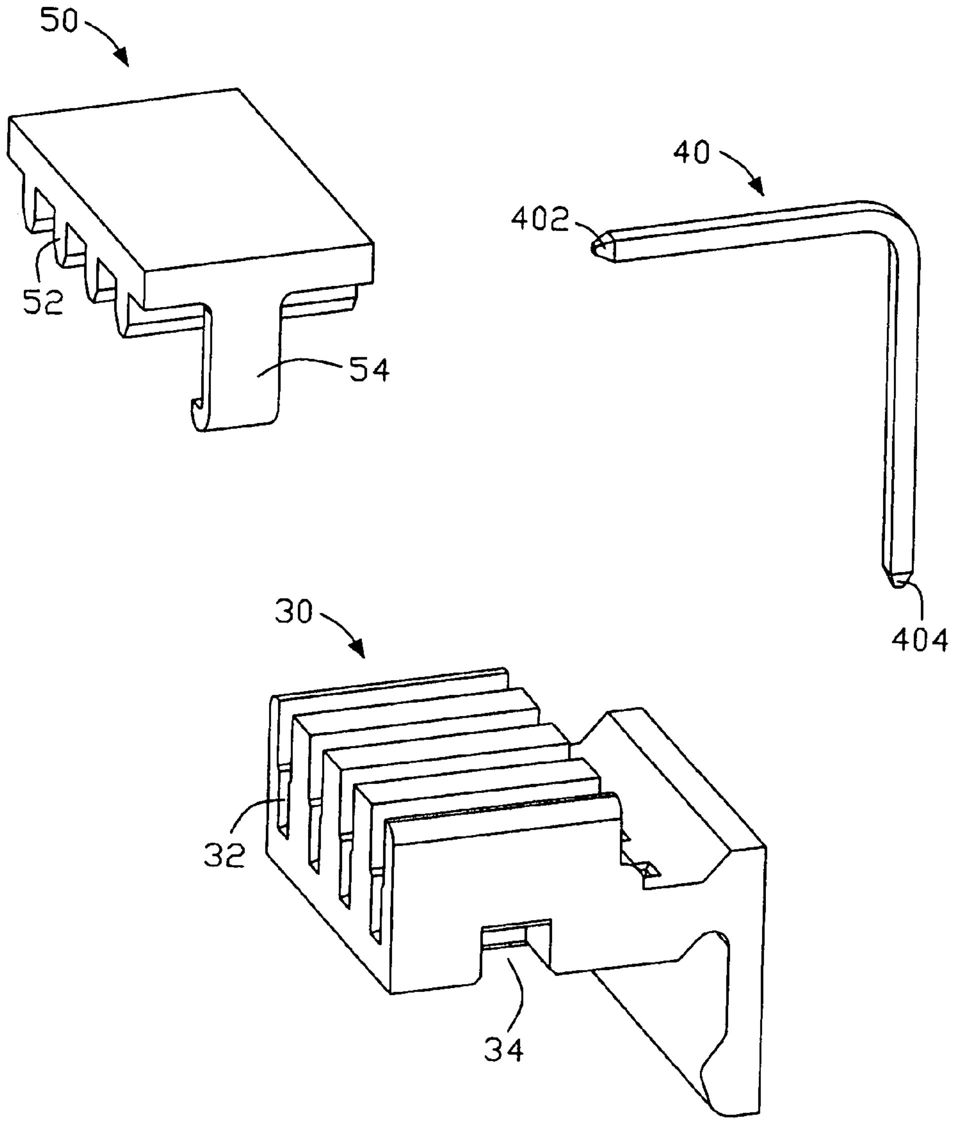
FIG. 3 is an exploded, isometric view of the header connector assembly of FIG. 1, but viewed from another aspect.

Referring to FIGS. 1 to 3, a header connector assembly according to the first embodiment of the present invention is shown. The header connector assembly includes an insulative housing 30 with an array of contact posts 40 held in passageways 32 respectively. The contact posts 40 are arranged such that first ends 402 of the posts 40 are allowed to extend from a first mating face 301 of the housing 30 for insertion into corresponding through-holes of a circuit board (not shown), and second ends 404 of the posts 40 extend beyond a second mating face 303 of the housing 30 for establishing electrical connection with complementary contacts of a mating connector (not shown). A protective cover 50 is attached to the insulative housing 30 at the first mating face 301 for engagement with the housing 30 such that after the protective cover 50 engages with the housing 30, the cover 50 and the housing 30 combine to form a complete planar mating surface 53, which is in size larger than the first mating face 301 of the housing 30, for engagement with the substrate, to be later described. Thus, a widen mating surface 53 for engaging with the substrate is achieved, thereby preventing the contact posts 40 from being disengaged from the circuit board.

In the present embodiment, the array of contact posts 40 is aligned in a row with second end portions 404 disposed along one side of the insulative housing 30, and each is preferably bend by a single metallic wire to form first and second end portions 402, 404 that are linked by a connecting portion 403. Preferably, the first and second end portions 402, 404 are substantially perpendicular to each other. The posts 40 typically have square cross-sectional shapes to be received in the complementary passageways 32, although other cross-sectional shapes, such as rectangular or round, may also be employed.

The insulative housing 30 includes a row of post receiving passageways 32, that are arranged open at one side, in a direction that is normal to the second mating face 303, for engagement with the cover 50 to cooperatively hold the respective posts 40 horizontally in the passageways 32. A pair of grooves 34 is provided along opposite side walls of the insulative housing 30 for receiving arms 54 of the protective cover 50.

The protective cover 50 includes a body section with a plurality of parallel spaced ridges 52 extending from a bottom section 51 thereof, for engagement with the respective passageways 32. The ridges 52 are configured to have planar end sidewalls 521, and dimensioned such that when the ridges 52 and the passageways 32 mate, the posts 40 received in the passageways 32 are engaged by the combinations of the ridges 52 and the passageways 32 to hold the posts 40 in interference fits. As a result, a complete planar mating surface 53 is formed by the combination of the housing first mating face 301 and the ridge end sidewalls 521, which is believed to be larger in size than a single first mating face 301. In some embodiments, the bottom section 51 may have a widen side surface 510 to enlarge the total planar mating surface 51. Further, when the cover 50 mates with the housing 30, complete channels are thus formed through the housing due to the combination of the ridges 521 and the passageways 32, for entirely surrounding portions of the contact posts that are received in the insulative housing 30, thereby preventing these contact posts from being exposed to the outside for subjection to contamination by the outside dust. In addition, the protective cover 50 is formed with a pair of arms 54 extending from opposite edges of the body section 50, in a direction that is normal to a bottom surface of the body section 50, so as to grip side walls of the insulative housing 30. In the present embodiment, the pair of arms 54 is engageably received in the grooves 34 of the insulative housing 30 to retain the cover 50 in the housing 30.

Referring particularly to FIG. 2, in assembly, the contact posts 40 are pre-inserted into the respective passageways 32 by the first and second end portions 402, 404 extending beyond the first and second mating faces 301, 303, respectively. The protective cover 50 is attached to the insulative housing 30 by its arms 54 received in the grooves 34 of the housing 30, and ridges 52 tightly engage with respective passageways 32 to hold the contact posts 40 in interference fits.

Figure 4:
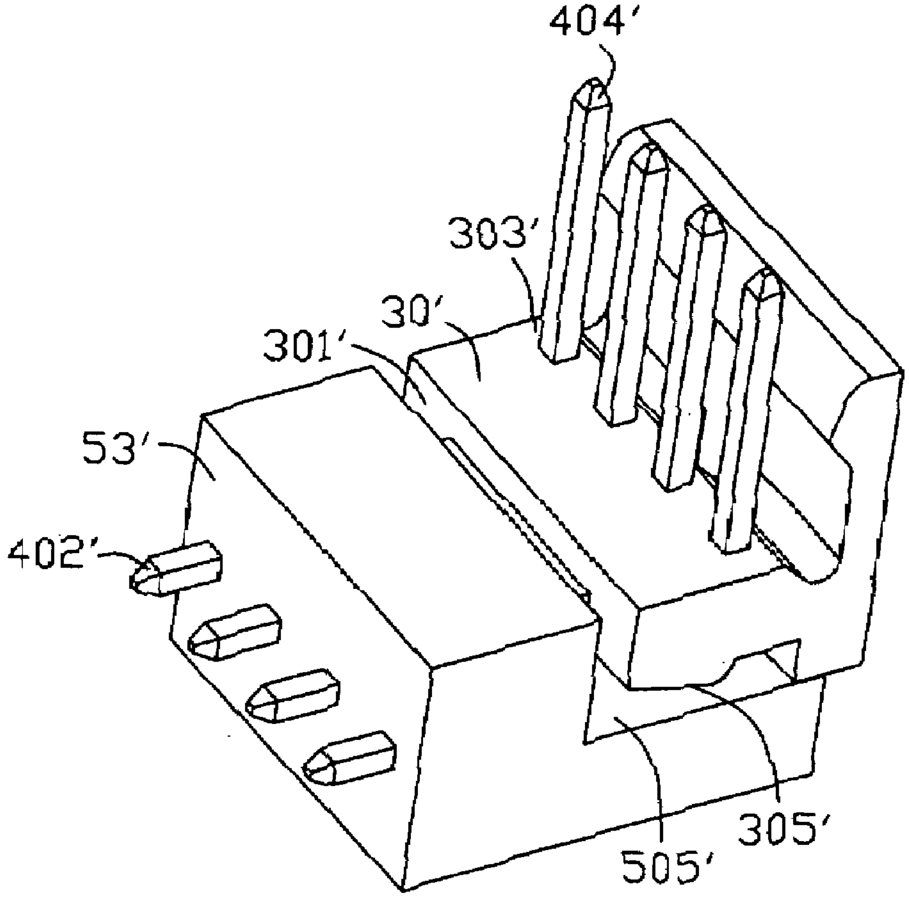
FIG. 4 is an assembled, isometric view of a header connector assembly according to a second embodiment of the present invention.
Figure 5:
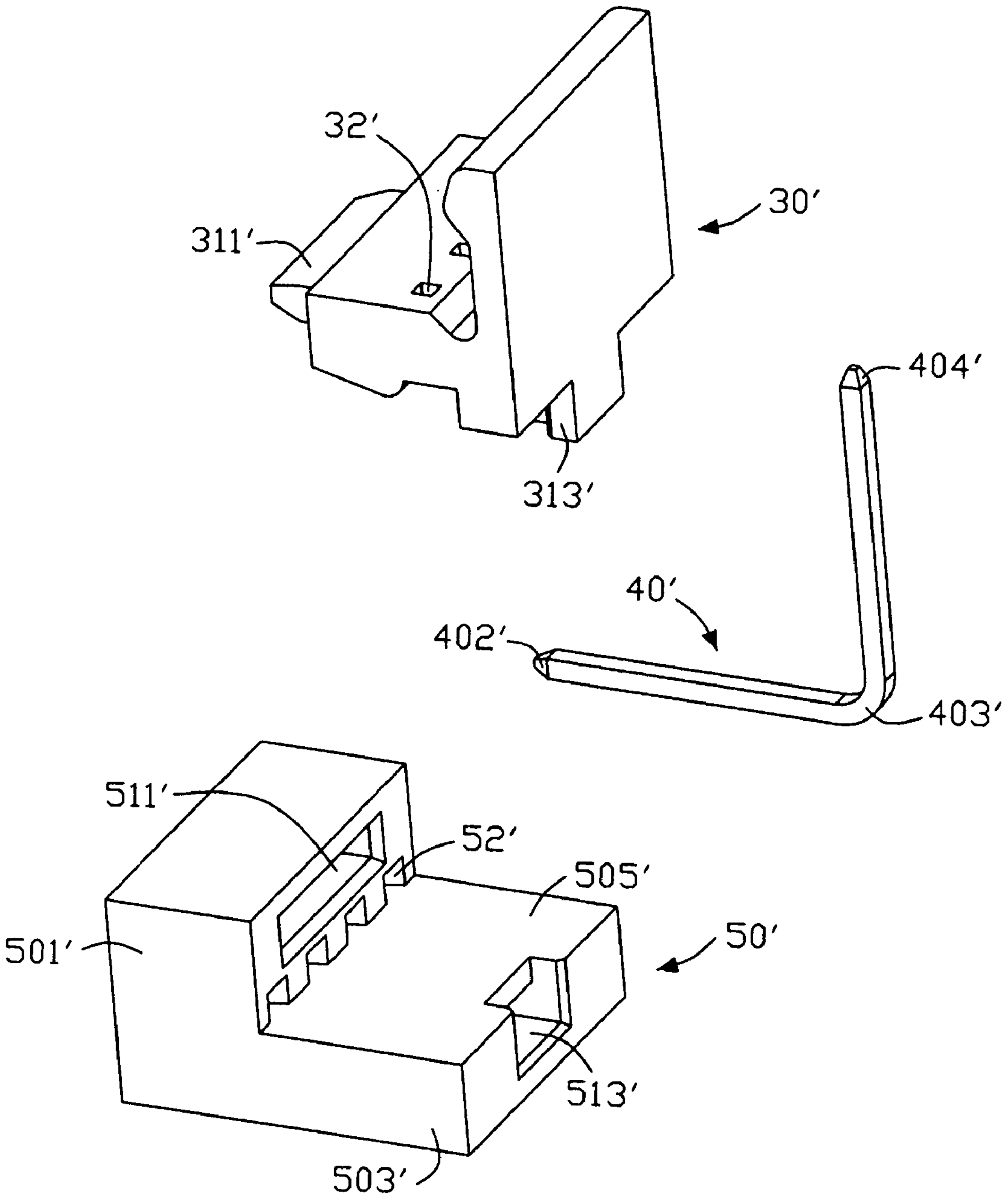
FIG. 5 is an exploded, isometric view of the header connector assembly of FIG. 4.
Figure 6:
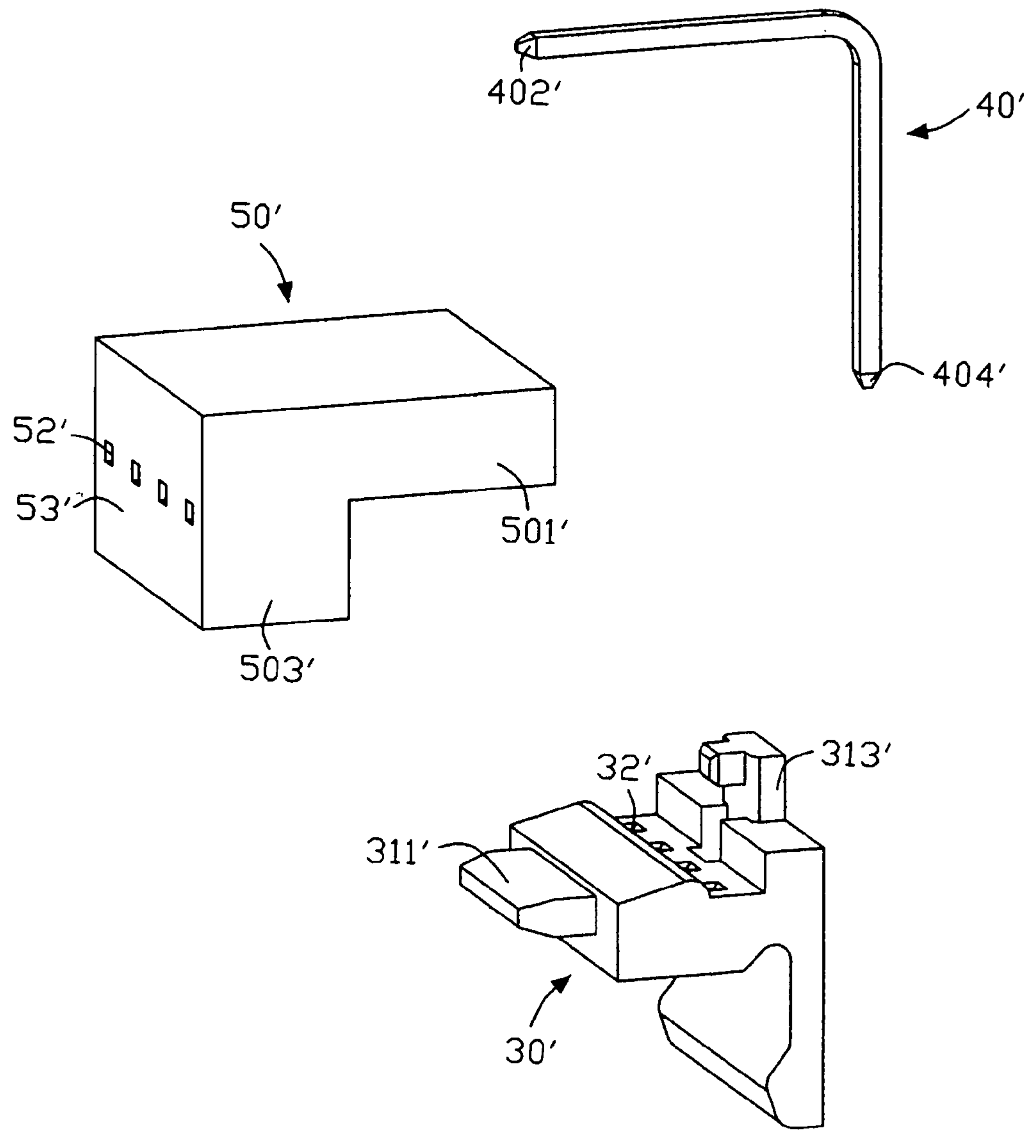
FIG. 6 is an exploded, isometric view of the header connector assembly of FIG. 1, but viewed from another aspect.
Figure 7:
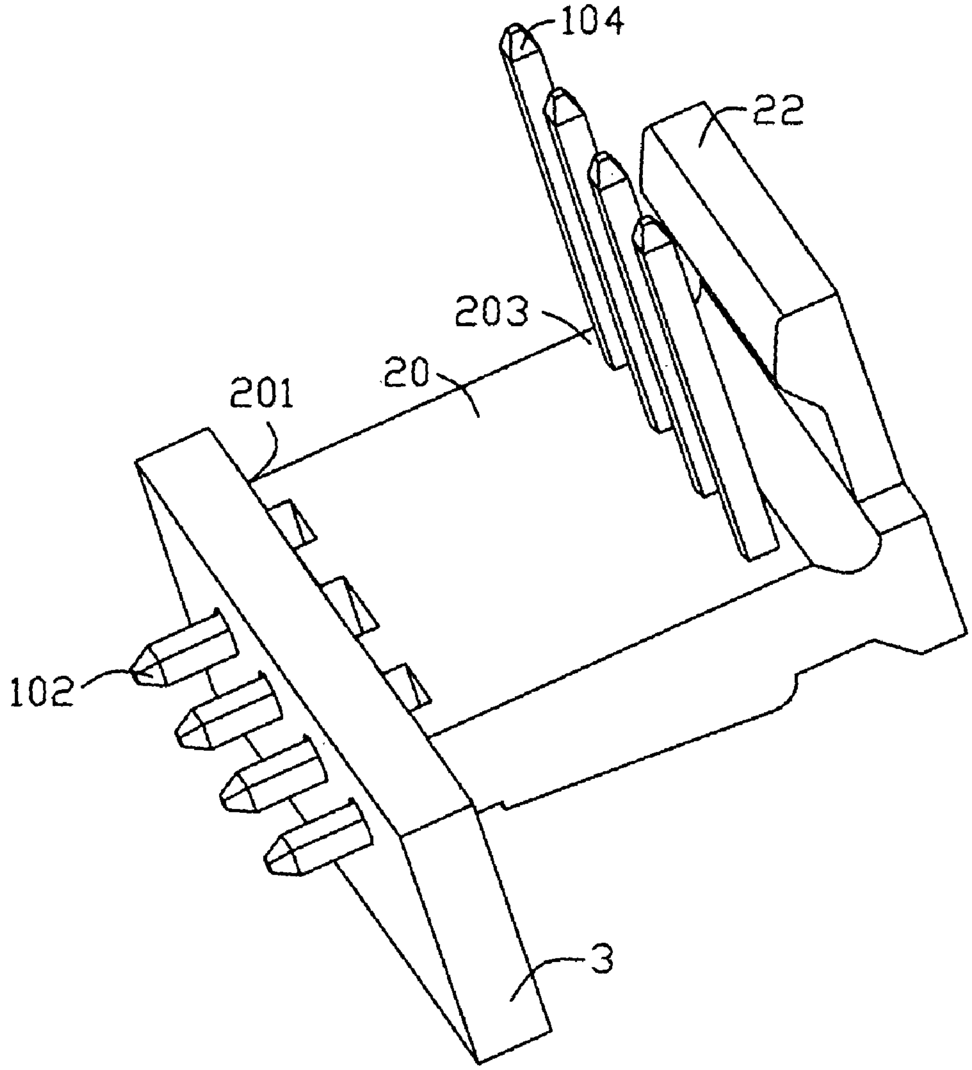
FIG. 7 (Related Art)
FIG. 7 is an isometric view of a conventional assembled header connector.

Referring to FIGS. 4 to 6, a header connector assembly according to the second embodiment of the present invention is shown. The header connector assembly includes an insulative housing 30' with an array of contact posts 40' held in passageways 32' respectively. The contact posts 40' are arranged such that first ends 402' of the posts 40' are allowed to extend from a first mating face 301' of the housing 30' for insertion into corresponding through-holes of a circuit board (not shown), and second ends 404' of the posts 40' extend beyond a second mating face 303' of the housing 30' for establishing electrical connection with complementary contacts of a mating connector (not shown). A protective cover 50' is attached to the insulative housing 30' at the first mating face 301' for engagement with the housing 30' such that after the protective cover 50' engages with the housing 30', the cover 50' and the housing 30' combine to form a complete planar mating surface 53', which is in size larger than the first mating face 301' of the housing 30', for engagement with the substrate, to be later described in detailed. Thus, a widen mating surface 53' for engaging with the substrate is achieved, thereby preventing the contact posts 40' from being disengaged from the circuit board.

In the present embodiment, the array of contact posts 40' is aligned in a row with second end portions 404' disposed along one side of the insulative housing 30', and each is preferably bend by a single metallic wire to form first and second end portions 402', 404' that are linked by a connecting portion 403'. Preferably, the first and second end portions 402', 404' are substantially perpendicular to each other. The posts 40' typically have square cross-sectional shapes to be received in the complementary passageways 32', although other cross-sectional shapes, such as rectangular or round, may also be employed.

The protective cover 50 includes a body section having a generally L cross-sectional shape with a planar vertical surface 53' at a front wall thereof. In the present embodiment, the planar surface of the protective cover 53' serves as the complete a mating surface, which is adapted for directly touching and engaging with a surface of the circuit board. A plurality of cavities 52' is configured to extend horizontally from the front wall surface 53' of the cover 50' for corresponding to the passageways 32' of the housing 30'. Each of the cavities 52' is dimensioned to hold the corresponding contact post 40' with an interference fit in the cavity 52'. The cover body section 50' is further formed with a relatively high body section 501' and a lower body section 503' depending from the high body section 501' to have such an L-shaped configuration. The lower body 503' defines a large horizontal planar plane 505' for mating with a bottom surface 305' of the insulative housing 30', so that when the protective cover 50' and the housing 30' mate, complete channels are thus formed between the cover 50' and the housing 30' at the bottom surface 305', for entirely surrounding portions of the contact posts that are received in the insulative housing 30'. Thus, these contact posts 40' are prevented from being exposed to the outside for subjection to contamination by the outside dust. In addition, the protective cover 50' is provided with a plurality of locating slots 511', 513', for receiving respective protrusions 311', 313' of the insulative housing 30' in order to be located with the insulative housing 30'. In the present embodiment, the high body section 501' and a lower body section 503' are respectively formed with locating slots 511', 513' along one side thereof.

The insulative housing 30' has a shape that comply with the L-shaped cover 50' so as to tightly engage with the protective cover 50'. In the present embodiment, the insulative housing 30' is formed with first and second protrusions 311', 313' for insertion into the receiving slots 511', 513', respectively. These protrusions 311', 313' can have any suitable shapes, for example, one or more wedge combined to form a single protrusion, which is not constructed to be limited thereto.

Referring particularly to FIG. 5, in assembly, the contact posts 40' are pre-inserted into the cavities 52' and the passageways 32' by the first end portions 402' extending beyond the mating surface 53' of the protective cover 50' through the first mating face 301', and the second end portions 404' extending beyond the second mating face 303' of the housing 30' in a condition that the protective cover 50' is releasably attached to the housing 30' but not in a full engagement with the insulative housing 30'. Then, the insulative housing 30' is further urged by external forces to make the protrusions 311', 313' to be held in the locating slots 511', 513' securely in a friction interference fit, until a desired full engagement between the insulative housing 30' and the protective cover 50' is achieved.

While the present invention has been described with reference to embodiments, the description of the invention is illustrative and is not to be construed as limiting the invention. Various of modifications to the present invention can be made to embodiments by those skilled in the art without departing from the true spirit and scope of the invention as defined by the appended claims.

What is claimed is:

1. A header connector assembly comprising:

an insulative housing having an array of passageways with contact posts held in the passageways, the contact posts having first and second end portions that are substantially perpendicular to each other, with the first and second end portions extending beyond first and second mating faces of the housing respectively, wherein the second mating face is adapted for engagement with contacts of a mating electrical connector; and a protective cover engageably attached to the insulative housing at the first mating face such that when the protective cover engages with the insulative housing, the cover and the housing combined to form a complete coplanar mating surface, which is adapted to face a substrate, in size being larger than the first mating face of the housing;

wherein the protective cover comprises a body section having a plurality of ridges extending from a bottom surface thereof for engagement with the respective passageways, such that the posts are engaged by combinations of the ridges and the passageways to form said complete planar mating surface at planar end sidewalls of the ridges.

2. The header connector assembly as recited in claim 1, wherein the cover body section comprises a pair of arms extending from edges of the body section in a direction normal to the bottom surface of the body section to grip side walls of the insulative housing so as to retain the cover on the housing when the cover is attached to the insulative housing.

3. The header connector assembly as recited in claim 2, wherein the insulative housing forms grooves along said side walls for receiving the pair of arms respectively.

4. A header connector assembly comprising a printed circuit board;

an insulative housing defining a generally right angle cross-section including a vertical section and a horizontal section;

a plurality of through holes defined in the vertical section adjacent to the horizontal section a plurality of contacts each defining a right angle configuration having a vertical segment, said horizontal segment extending through said through holes, respectively; and a protective cover assembled to the vertical section, said vertical segment engaging the protective cover; wherein the assembled housing and protective cover defines a coplanar mounting area which is positioned upon the printed circuit board and is larger than a cross-sectional area of said vertical section, wherein said mounting area is formed by the said protective cover solely.

5. The header connector assembly as claimed in claim 4, wherein said mounting area is commonly formed by both said housing and said protective cover.

6. The header connector assembly as claimed in claim 4, wherein the whole vertical segment of said contact is horizontally communicate to the an exterior before said housing and said protective cover have been assembled together.

7. The header connector assembly as claimed in claim 4, wherein said housing and said protective cover are horizontally assembled together.

8. A header connector assembly comprising an insulative housing having an upside-down L-shaped cross-section with a plurality of L-shaped contacts therein;

an insulative protective cover having an upstanding L-shaped cross-section with a plurality of holes therein;

the insulative housing and the insulative protective cover being assembled together; wherein a vertical section of the housing is essentially located in a space cooperatively formed by a pair of upwardly extending members and a horizontal portion of said protective cover, and a vertical segment of the contact extends through the corresponding through hole and out of a mounting face of said protective cover for mandating to a printed circuit board.

* * * * *